United States Patent [19]
Akiba et al.

[11] Patent Number: 6,028,800
[45] Date of Patent: Feb. 22, 2000

[54] SENSE AMPLIFIER DRIVER HAVING VARIABLE POWER-SUPPLY VOLTAGE

[75] Inventors: Takesada Akiba, Tachikawa; Goro Kitsukawa, Hinode-machi; Hiroshi Otori; Masayuki Nakamura, both of Ome; Hideo Sunami, Hinode-machi, all of Japan; Adin Hyslop, Dallas, Tex.

[73] Assignee: Hitachi Ltd, of Japan, Tokyo, Japan

[21] Appl. No.: 08/732,777

[22] Filed: Oct. 15, 1996

Related U.S. Application Data

[60] Provisional application No. 60/009,397, Jan. 16, 1996.
[51] Int. Cl.⁷ .................................................. G11C 16/04
[52] U.S. Cl. ................ 365/205; 365/189.09; 365/189.11
[58] Field of Search .............................. 365/205, 189.09, 365/189.11, 207, 185.23, 226

[56] References Cited

U.S. PATENT DOCUMENTS 5,027,324  6/1991  Seo .......................................... 365/205

*Primary Examiner*—David Nelms
*Assistant Examiner*—David Lam
*Attorney, Agent, or Firm*—Haynes & Boone, L.L.P.

[57] ABSTRACT

An apparatus and method for a logic circuit that advantageously adapts to different operating voltages. In a preferred embodiment, a logic circuit of the present invention is implemented to drive a large capacitive load and includes a first driver, comprising a set of small, low-current drive transistors, a second driver, comprising a set of large, high-speed transistors, and an additional transistor connected between the two drivers. The additional transistor can be selectively enabled to speed up the operation of the logic circuit, and disabled to reduce the peak current of the logic circuit. The additional transistor is enabled by a voltage detection signal, which is active when the operating voltage of the chip is at a low level and inactive when the operating voltage of the chip is at a high level.

16 Claims, 7 Drawing Sheets

SENSE AMPLIFIER DRIVER HAVING VARIABLE POWER-SUPPLY VOLTAGE

CROSS REFERENCE

This application claims the benefit of U.S. Provisional Application No. 60/009,397, filed Jan. 16, 1996.

BACKGROUND OF THE INVENTION

The present invention relates generally to semiconductor design technology, and more particularly, to a system and method for enabling logic circuits to adapt to different operating voltages.

Speed and peak current have always been important characteristics in integrated circuit, or "chip," designs. Speed is obviously an important characteristic because of the popular demand for faster electronic systems, such as faster computers. Peak current reduction is another important design characteristic for large-scale integrated circuits because large peak currents have a detrimental effect on the chip voltage. For example, high peak currents, combined with parasitic resistance of the chip package and wire lines, cause noise and supply voltage bounce. Furthermore, high peak currents interfere with the reliability of electron migration, potentially resulting in damage to wires inside the chip. This in turn results in the timings of individual circuits being changed, and internal timing constraints being missed, causing data to be corrupted. Furthermore, the threshold voltages of input buffers, differential amplifiers, and reference voltage generators are adversely affected by uncontrolled peak currents.

Conventional chip designs can be optimized for either peak current reduction or high speed, but not both. Therefore, chip designers have been forced to choose to optimize one over the other. This problem is exacerbated by the fact that modern integrated circuits utilize an external power supply ("$V_{DD}$") that may be set to different voltage levels. For example, one chip may require an external power supply of 3.3V, while a second chip that performs the same function may require an external power supply of 2.5V.

Conventional chips, especially those that have tight restrictions on speed and peak current, cannot always operate at different external power supplies. For example, a chip designed to operate at 3.3V would need relatively small transistors to maintain a low peak current. The 3.3V chip design, however, would be capable of meeting any speed requirements because of the higher external voltage. Conversely, a chip designed to operate at 2.5V would need relatively large transistors to facilitate high speed operation. The 2.5V chip design, however, would be capable of meeting the peak current restrictions of the chip design because of the lower external voltage.

To demonstrate the different transistor characteristics, reference is made to FIG. 1, which shows two conventional inverters 1a and 1b. The inverter 1a comprises an n-channel metal oxide semiconductor ("NMOS") transistor 2a of a first size 3a, a p-channel metal oxide semiconductor ("PMOS") transistor 4a and an output terminal 6a. The inverter 1b comprises an NMOS transistor 2b of a second size 3b, a PMOS transistor 4b and an output terminal 5b, wherein the size 3b of the transistor 2b is larger than the size 3a of the transistor 2a. As a result, the inverter 1a will draw less current than inverter 1b, while inverter 1b will transition faster than inverter 1a, as demonstrated below.

Referring to FIGS. 2 and 3 the two inverters 1a and 1b are each shown operating at 3.3V and 2.5V. Waveforms 6v and 6i represent the output voltage and current, respectively, of the inverter 1a operating at 3.3V, while waveforms 7v and 7i represent the output voltage and current, respectively, of the inverter 1b operating at 3.3V. Likewise, waveforms 8v and 8i represent the output voltage and current, respectively, of the inverter 1a operating at 2.5V, while waveforms 9v and 9i represent the output voltage and current, respectively, of the inverter 1b operating at 2.5V.

Considering the 3.3V operation example, the two inverters 1a, 1b, have timing characteristics, as illustrated in FIG. 2 by the voltage-timing waveforms 6v and 7v, respectively. However, as illustrated in FIG. 3, the peak current of inverter 1b, as shown by waveform 7i, is much greater than that of inverter 1a, as shown by waveform 6i. Therefore, the design of a chip operating at 3.3V would derive more benefit from use of the inverter 1a because of the reduced peak current.

Considering the 2.5V operation example, the inverter 1b is faster than the inverter 1a, as illustrated in FIG. 2 by the voltage-timing waveforms 9v and 8v, respectively. However, neither of the current waveforms 9i and 8i of the two inverters 1a, 1b, respectively, reach a very high level. Therefore, the design of the chip operating at 2.5V would derive more benefit from use of the inverter 1b.

Chip designers have dealt with multiple operating voltages in different ways. In a first solution, different chip designs are produced, one for the first operating voltage and another for the second operation voltage. For example, a first chip design would include gates like the low peak current inverter 1a for 3.3V operation, while a second chip design would include gates like the high speed inverter 1b for 2.5V operation. However, having multiple chip designs result in many difficulties, such as increased mask expense, more difficult production resulting from the need to keep the designs separated, and distribution difficulties resulting from the need to maintain the appropriate quantity of chips of each design.

A second solution is to produce a chip design that meets all the characteristic requirements of both operating voltages. For example, the chip would comprise a new inverter, with a size between 3a and 3b of FIG. 1. Although this results in a single design, the chip is not optimized for either of the two operating voltages. As a result, the chip has a poor production yield and is inferior to other chips designed exclusively for a particular operating voltage.

Therefore, what is needed is a system and method for providing a single chip with logic that adjusts to the voltage applied to the chip to maximize the efficiency of the chip with respect to speed and/or peak current.

SUMMARY OF THE INVENTION

The present invention, accordingly, provides a system and method for a logic circuit that advantageously adapts to different operating voltages. In a preferred embodiment, a logic circuit of the present invention is implemented to drive a large capacitive load and includes a first driver, comprising a set of small, low-current drive transistors, a second driver, comprising a set of large, high-speed transistors, and an additional transistor connected between the two drivers. The additional transistor can be selectively enabled to speed up the operation of the logic circuit, and disabled to reduce the peak current of the logic circuit. The additional transistor is enabled by a voltage detection signal, which is active when the operating voltage of the chip is at a low level and inactive when the operating voltage of the chip is at a high level.

A technical advantage achieved with the present invention is that during low operating voltage conditions, when peak current is less of a concern, the speed of operation of the circuit is increased by the use of the additional transistor operating in parallel with the set of smaller transistors.

Another technical advantage achieved with the present invention is that during high operating voltage conditions, when peak current is more of a concern, the circuit operates without use of the additional transistor, thereby reducing the peak current used by the circuit.

Another technical advantage achieved with the present invention is that it enables a single circuit to embody the optimal characteristics for two different operating voltages.

DETAILED DESCRIPTION OF THE PREFERRED EMBODIMENT

Figure 1A:
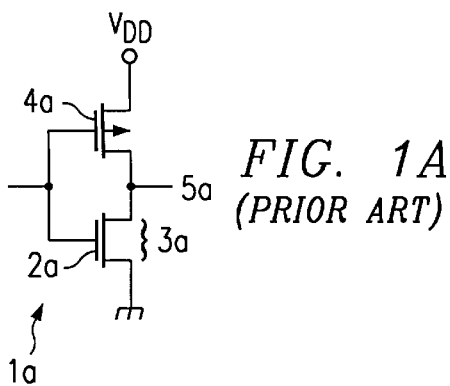
FIGS. 1a and 1b are detailed schematics of two conventional inverters.
Figure 1B:
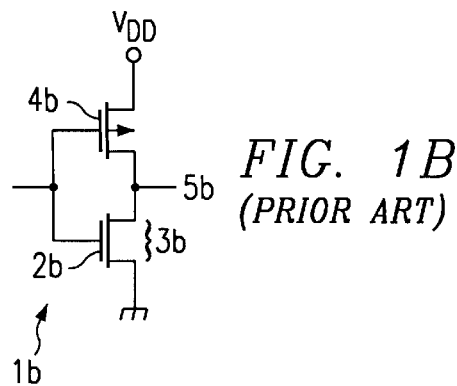
Figure 2:
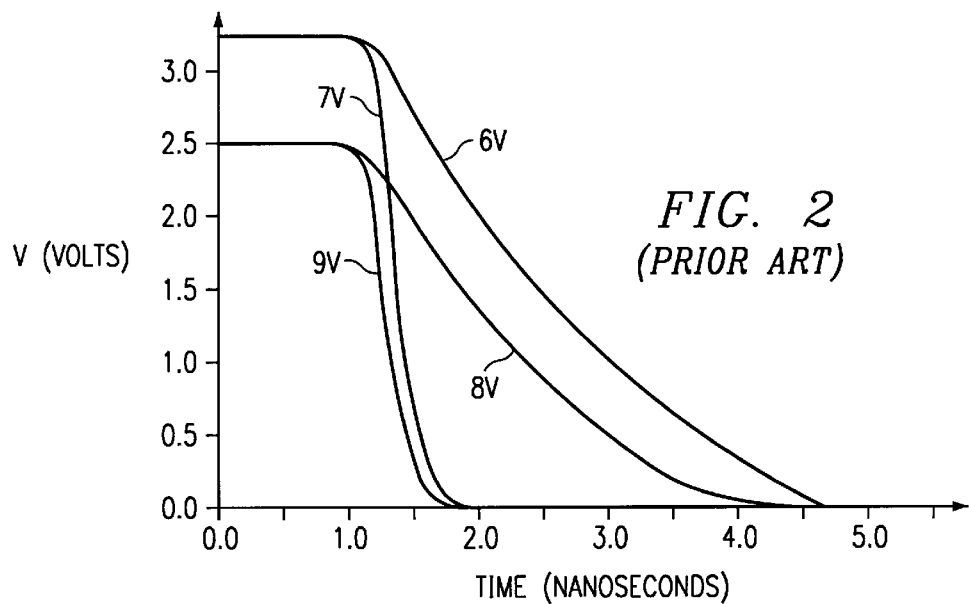
FIG. 2 is graph showing the conventional voltage vs. time characteristics of the inverters of FIG. 1.
Figure 3:
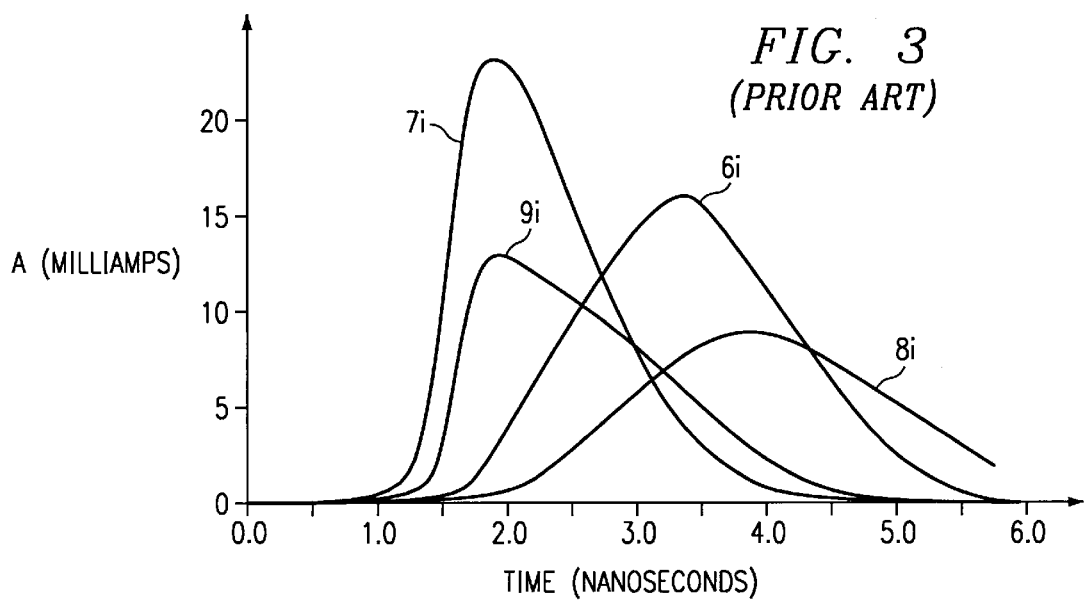
FIG. 3 is graph showing the conventional current vs. time characteristics of the inverters of FIG. 1.

As described above, FIGS. 1, 2 and 3 respectively show conventional logic circuits and their voltage and current characteristics during transition from one state to another.

Figure 4:
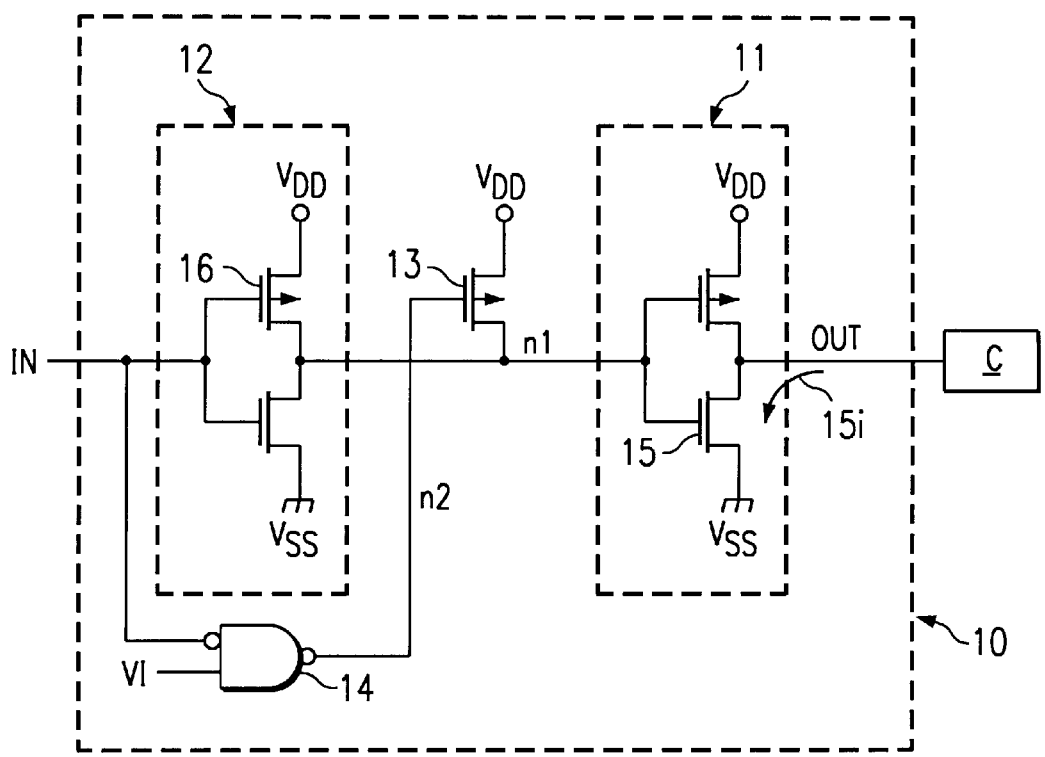
FIG. 4 is a schematic of a circuit embodying a first implementation of the present invention.

Referring to FIG. 4, the reference numeral 10 refers, in general, to a first implementation of an integrated circuit device embodying features of the present invention. The device 10 utilizes a positive power supply ($V_{DD}$) and a negative power supply ($V_{SS}$), and is designed to drive a large capacitive load C. The device 10 includes an input IN, an output OUT, two inverter drivers 11 and 12, a PMOS transistor 13 and a logic circuit 14. An NMOS transistor 15 of the driver 11 has a large gate width for high-speed operation. The current drawn by the driver 11 is shown graphically by the arrow 15$i$. An input node n1 of the driver 11 is driven by the inverter 12 and the PMOS transistor 13. The PMOS transistor 13 is connected in parallel with the inverter 12 and has a large gate width for high-speed operation. A PMOS transistor 16 of the inverter 12 has a small gate width for low peak current operation. The PMOS transistor 13 is controlled by a logic circuit 14, which includes two inputs, the input IN and a voltage level signal V1, and an output node n2.

Figure 5:
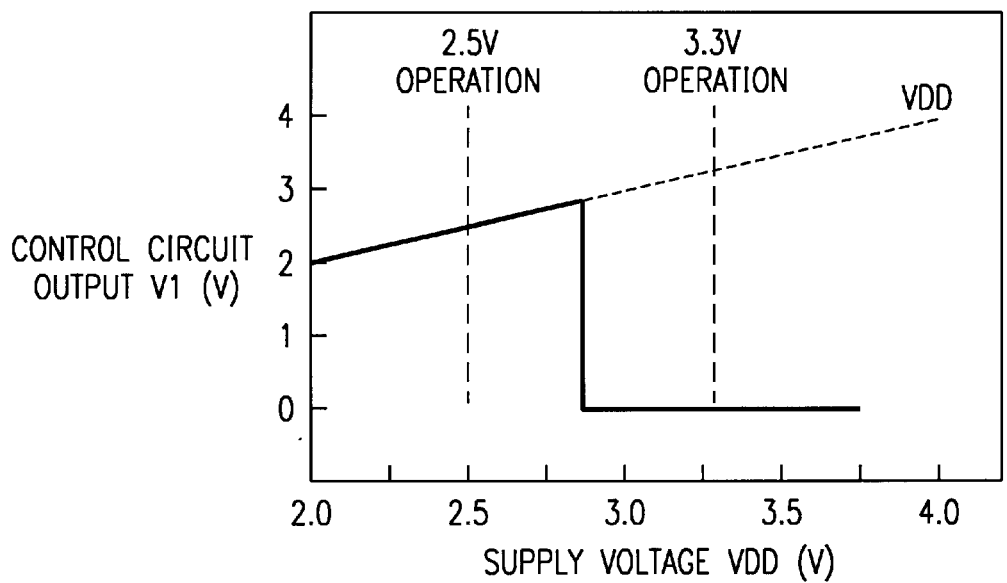
FIG. 5 is a graph of a V1 voltage signal with respect to operating voltage used to implement the present invention.

As illustrated in FIG. 5, the level of the V1 signal is responsive to the $V_{DD}$ operating voltage. In particular, if $V_{DD}$ is operating at 2.5V, the V1 signal will be "high." Conversely, if $V_{DD}$ is operating at 3.3V, the V1 signal will be "low." Various circuits for generating the V1 signal are discussed in greater detail below with reference to FIGS. 14–18.

Figure 6:
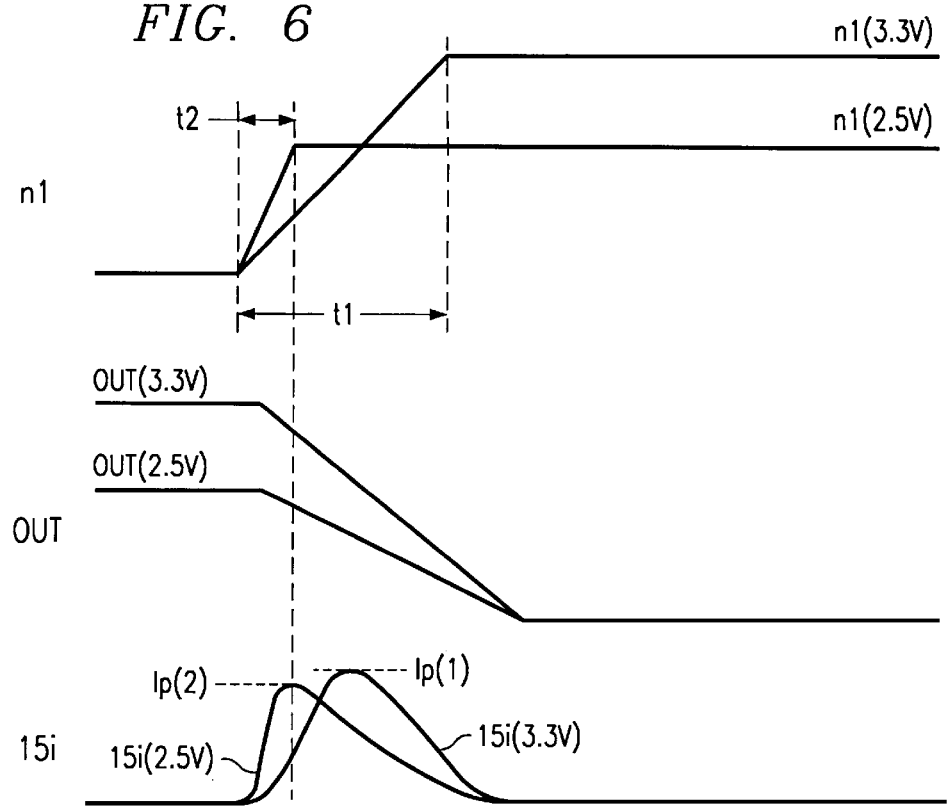
FIG. 6 is a timing diagram of the circuit of FIG. 4.

Referring to FIGS. 4–6, in operation, if $V_{DD}$ is at 3.3V, then the V1 signal will be low (FIG. 5) and the output node n2 will remain high. As a result, the PMOS transistor 13 will remain inactive and never drive the input node n1. In this operation, the input node n1 has a long transient time t1 because only the PMOS transistor 16 is driving it. Therefore, the ability of the NMOS transistor 15 to draw the current 15$i$ increases gradually, so that it only reaches a peak current level Ip(1).

If $V_{DD}$ is operating at 2.5V, then the V1 signal will be high (FIG. 5). As a result, the signal at output node n2 will follow the input signal IN and the PMOS transistor 13 will be active and drive the input node n1 in parallel with the transistor 16. In this operation, the signal at input node n1 has a short transient time t2 because both the PMOS transistor 16 and the PMOS transistor 13 are driving the input node n1. Therefore, the ability of the NMOS transistor 15 to draw the current 15$i$ increases quickly, so that it reaches a peak current level Ip(2).

Figure 7:
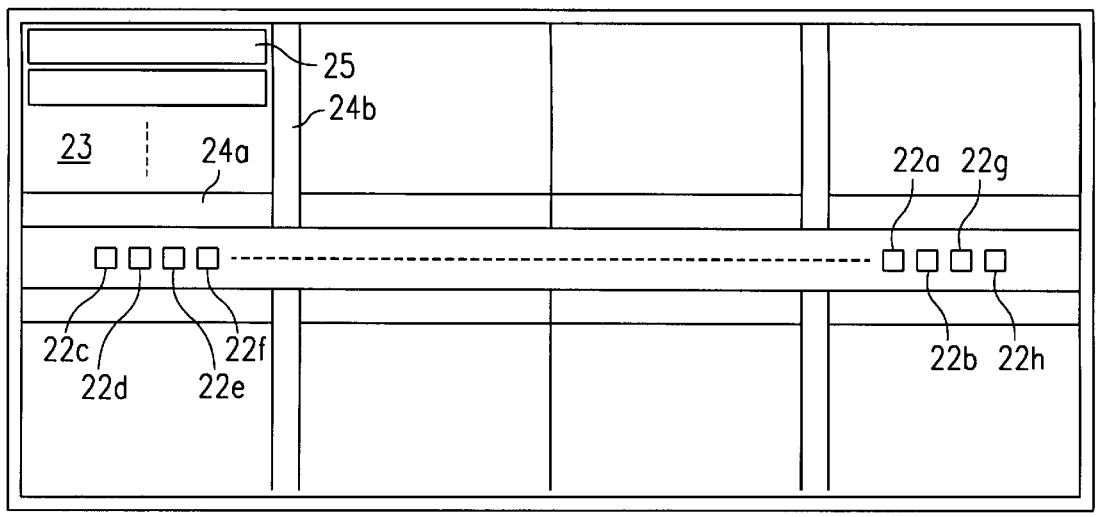
FIG. 7 is a simplified block diagram of a DRAM embodying a second implementation of the present invention.

Referring to FIG. 7, the reference numeral 20 refers, in general, to a second implementation of an integrated circuit device embodying features of the present invention. The device 20 is a 256 Mbit dynamic random access memory (DRAM) implemented using conventional complimentary metal oxide semiconductor (CMOS) technology, it should be understood that the present invention is not limited to use with a DRAM, nor is it limited to use in CMOS, but may be used in conjunction with many other devices of various technologies.

The device 20 includes a number of control signal pads and power pads, which act as external terminals. The control signal pads include a row address strobe (RAS) pad 22a, a column address strobe (CAS) pad 22b, and a group of address pads 22c–22f, each of which is connected to an external controller (not shown). The power pads include a positive power supply ($V_{DD}$) pad 22g and a negative power supply ($V_{SS}$) pad 22h, each respectively connected to a corresponding external power supply (not shown). The device 20 also includes a set of array blocks of memory cells, such as an array block 23, and a group of main address decoders, such as a column decoder 24a and a row decoder 24b. The array blocks are selected by signals from the pads 22a–22f, through the main address decoders 24a, 24b. Array block 23, which is representative of the remaining array blocks, is further divided into many subarrays, one of which is shown in FIG. 5, and is designated by reference numeral 25.

For the remainder of the detailed description, the subarray 25 will be described, along with only a few bits and circuits associated with the subarray. However, it should be understood that the discussion of the subarray 25, individual bits of the subarray, and circuits surrounding the subarray, are limited in quantity only for ease in description. Therefore, the remaining description is a simplified version of the preferred embodiment and is intended to illustrate, and not to limit, the invention.

Figure 8:
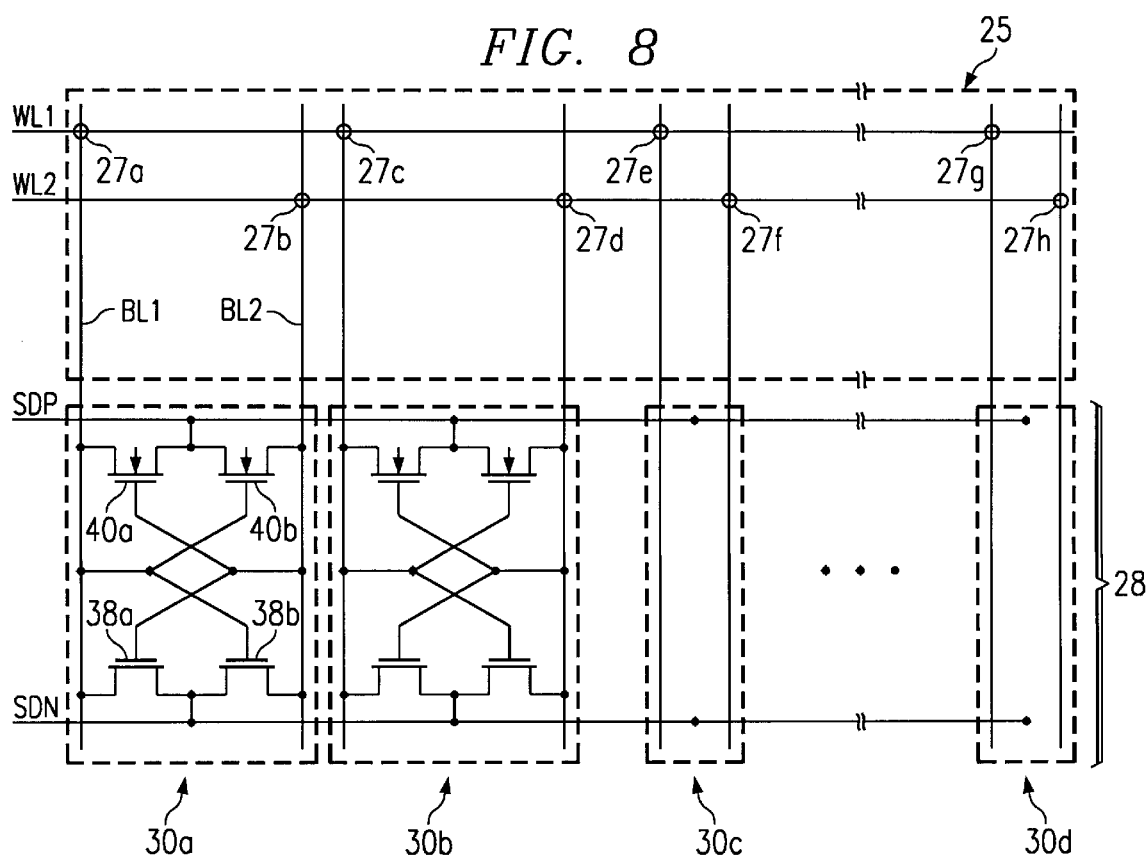
FIG. 8 is a simplified block diagram of a subarray of the DRAM of FIG. 7, including sense amplifier circuits.

Referring to FIG. 8, individual bits of the subarray 25 are conventionally selected by word lines. For example bits 27a–27h are selected by first and second word lines WL1, WL2, across the subarray 25. Also in a conventional manner, each bit of subarray 25 drives a bit line to a sense amplifier area 28. For example the bit 27a drives a first bit line BL1 and the bit 27b drives a second bit line BL2. In the preferred embodiment, the sense amplifier area 28 comprises 128 identical sense amplifier circuits. Two such sense amplifier circuits are represented by circuits 30a and 30b and the remaining 126 sense amplifier circuits are collectively represented by the boxes 30c and 30d. The sense amplifier circuit 30a comprises two NMOS transistors 38a, 38b, and two PMOS transistors 40a, 40b, connected between the bit lines BL1 and BL2 as shown. All four transistors 38a, 38b, 40a, 40b are cross-coupled in a conventional latching manner for storing signals from the bit lines BL1 and BL2. The remaining sense amplifiers 30b–30d also comprise transistors similar to those described above.

The sense amplifier circuit 30a is activated by two latch enable signals SDN and SDP, which run to the NMOS transistors 38a, 38b, and PMOS transistors 40a, 40b, respectively. In addition to the transistors of the sense amplifier circuit 30a, the SDN and SDP signals also run to the sense amplifier circuit 30b, and the remaining 126 similar sense amplifier circuits 30c–30d, thereby carrying a high capacitive load.

Figure 9:
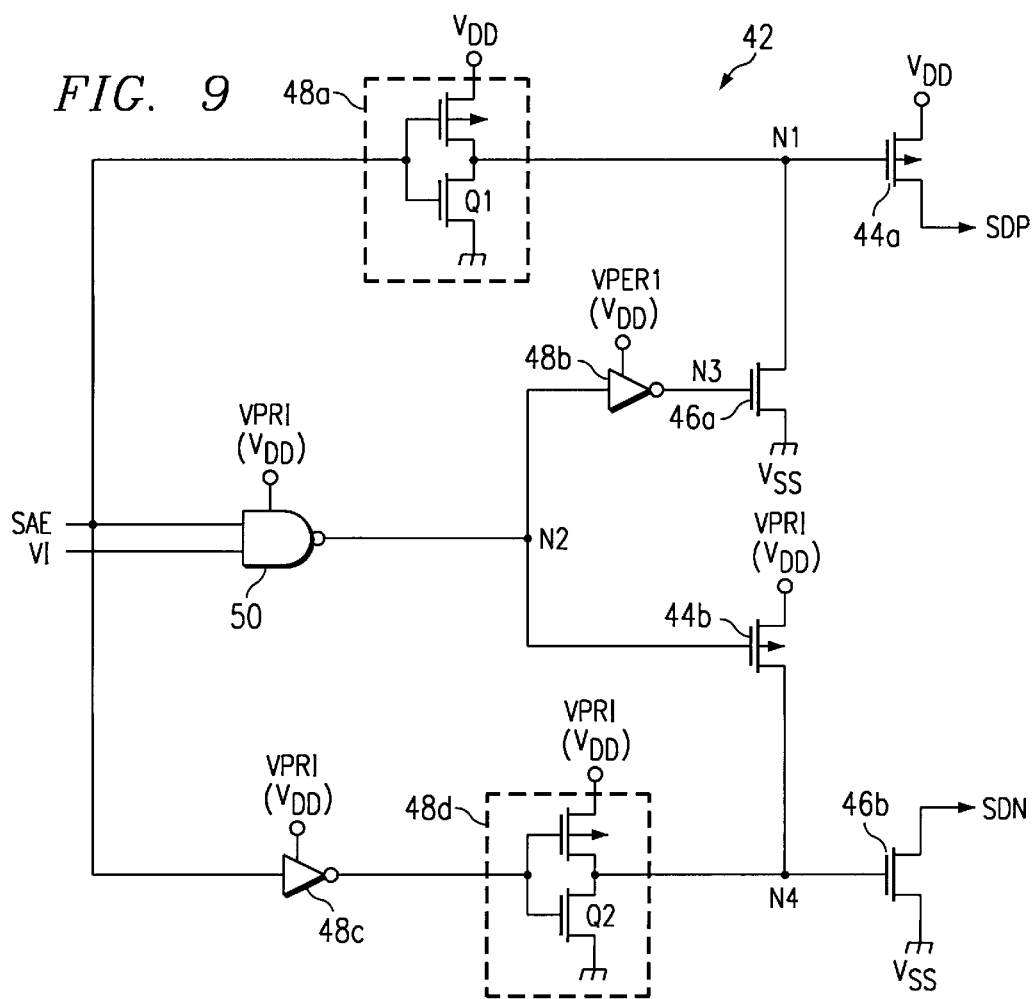
FIG. 9 is a detailed schematic of the logic circuit of the present invention, as used in the DRAM of FIG. 7.

Referring to FIG. 9, the SDN and SDP signals are produced by a logic circuit 42. The circuit 42 includes two input signals, the V1 signal (FIG. 5) and a sense amplifier enable ("SAE") signal. The SAE signal is a conventional sense amplifier enable signal, used to activate the sense amplifiers located in the sense amplifier area 28. The circuit 42 further comprises two PMOS transistors 44a, 44b, two NMOS transistors 46a, 46b, four inverters 48a–48d, and one two-input NAND gate 50. The NMOS transistor 46a is connected in parallel with a drive NMOS transistor Q1 of the inverter 48a, and the PMOS transistor 44b is connected in parallel with a drive PMOS transistor Q2 of the inverter 48d. Each size of the transistors Q1 and Q2 is optimized for 3.3V operation. Furthermore, the circuit 42 has four nodes respectively labeled N1, N2, N3 and N4. These nodes are used to describe the operation of the circuit 42, as discussed below with reference to FIGS. 10 and 11.

The circuit 42 is powered by the same $V_{DD}$ and $V_{SS}$ power supplies described with FIG. 4. Furthermore, a second positive peripheral (VPERI) power supply also powers the circuit 42. The $V_{PERI}$ power supply is created by a conventional, voltage regulator and is used to power the peripheral circuits of the DRAM at a constant voltage level for different values of $V_{DD}$. Although in the preferred embodiment, two positive power supplies $V_{DD}$ and $V_{PERI}$ are used, this is only a design choice, and the circuit 42 can utilize either or both positive power supplies, in various arrangements, and still employ the benefits of the present invention.

Therefore, the operation described below applies equally for a single or double positive power supply, with differences specifically noted.

Figure 10:
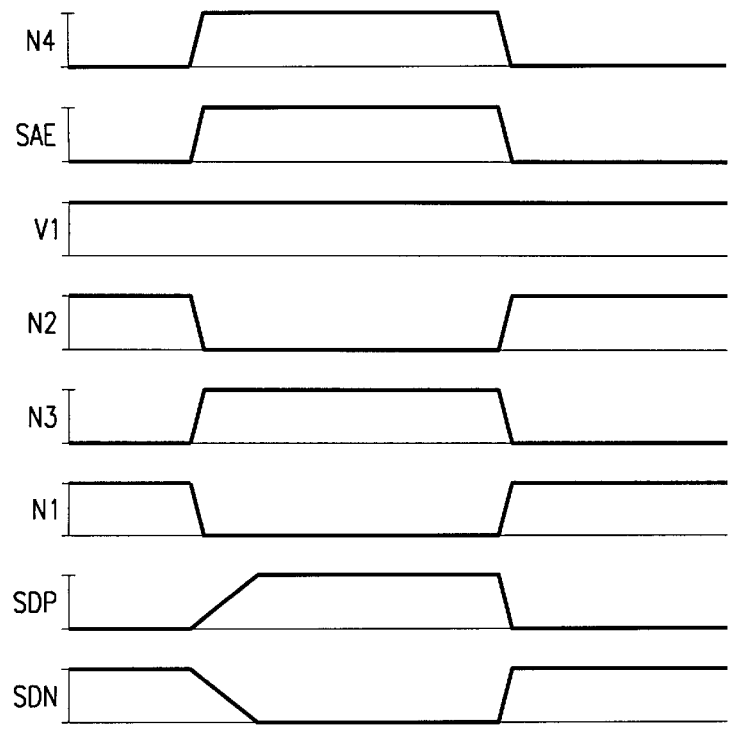
FIG. 10 is a timing diagram of the logic circuit of FIG. 9, utilizing a 2.5V power supply.
Figure 11:
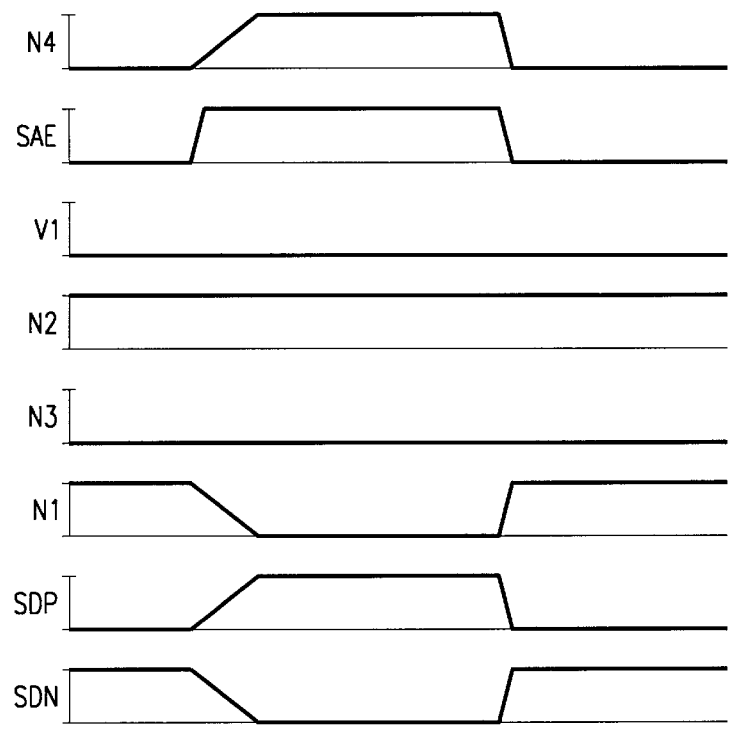
FIG. 11 is a timing diagram of the logic circuit of FIG. 9, utilizing a 3.3V power supply.

FIGS. 10 and 11 are timing diagrams illustrating the operation of the circuit 42 (FIG. 9) at 2.5V and 3.3V, respectively. The signals SAE, SDP and SDN have the same timings for both operating voltage levels, independent of the V1 signal. In contrast, the signals at the nodes N1, N2, N3 and N4 are dependent on the V1 signal. When $V_{DD}$ is equal to 2.5V, the V1 signal remains high (FIG. 5) and the signals at the nodes N2 and N3 transition high and low responsive to the SAE input, as shown in FIG. 10. As a result, the transistors 46a and 44b (FIG. 9) transition on and off responsive to the SAE input, thereby increasing the effective size of the inverters 48a and 48d, respectively, so that the inverter size is optimized for 2.5V operation. However, referring to FIG. 11, when $V_{DD}$ is equal to 3.3V, the V1 signal remains low and the signals at the nodes N2 and N3 remain high and low, respectively. As a result, the transistors 46a and 44b (FIG. 9) remain off, and the inverter size remains optimized for 3.3V operation.

Figure 12:
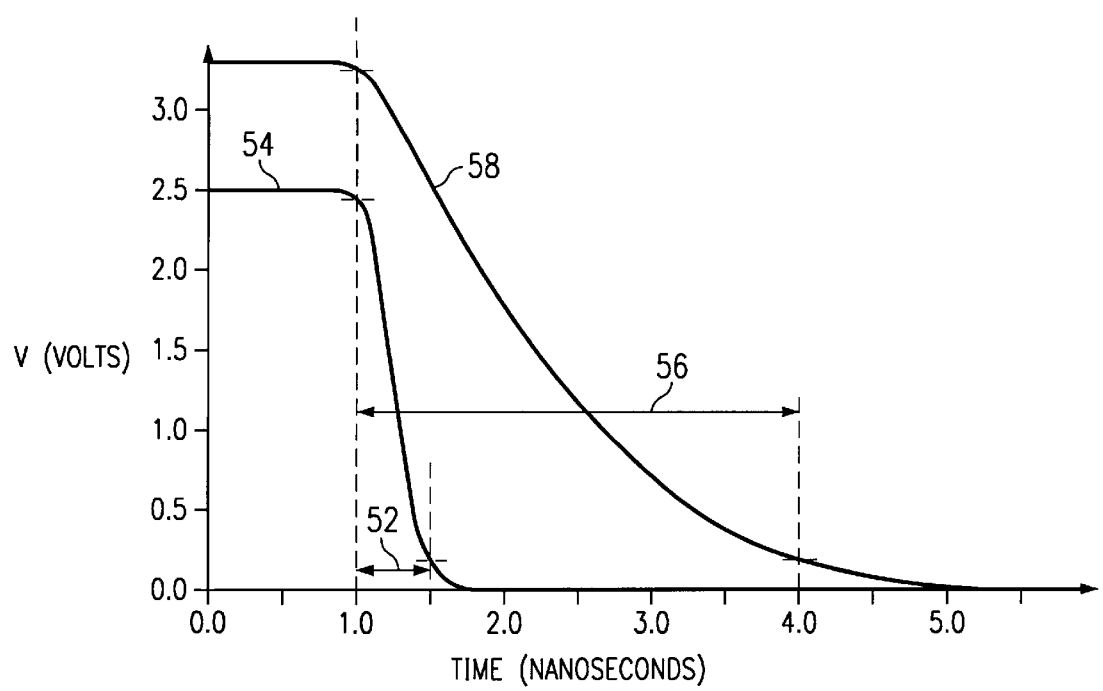
FIG. 12 is a graph showing the voltage vs. time characteristics of the logic circuit of FIG. 9.

In this manner, the circuit 42 remains fast during low voltage (2.5V) operation and retains low peak current during high voltage (3.3V) operation. Referring to FIGS. 9 and 12, when $V_{DD}$ is 2.5V, (V1 is high), a transition time 52 of the signal at node N1 from high to low is quick, as shown in a waveform 54, due to a combination of the inverter 48a and the NMOS transistor 46a. The transition time (not shown) of the signal at the node N4 is also quick, due to a combination of the inverter 48d and the PMOS transistor 44b. In addition, when $V_{DD}$ is 3.3V, (V1 is low), the transition time 56, of the signal at the node N1, represented by a waveform 58, is adequately quick, despite being pulled by the inverter 48a alone.

Furthermore, the transition time (not shown) of the signal at the node N4 is also adequately quick, despite being pulled by the inverter 48d alone.

Figure 13:
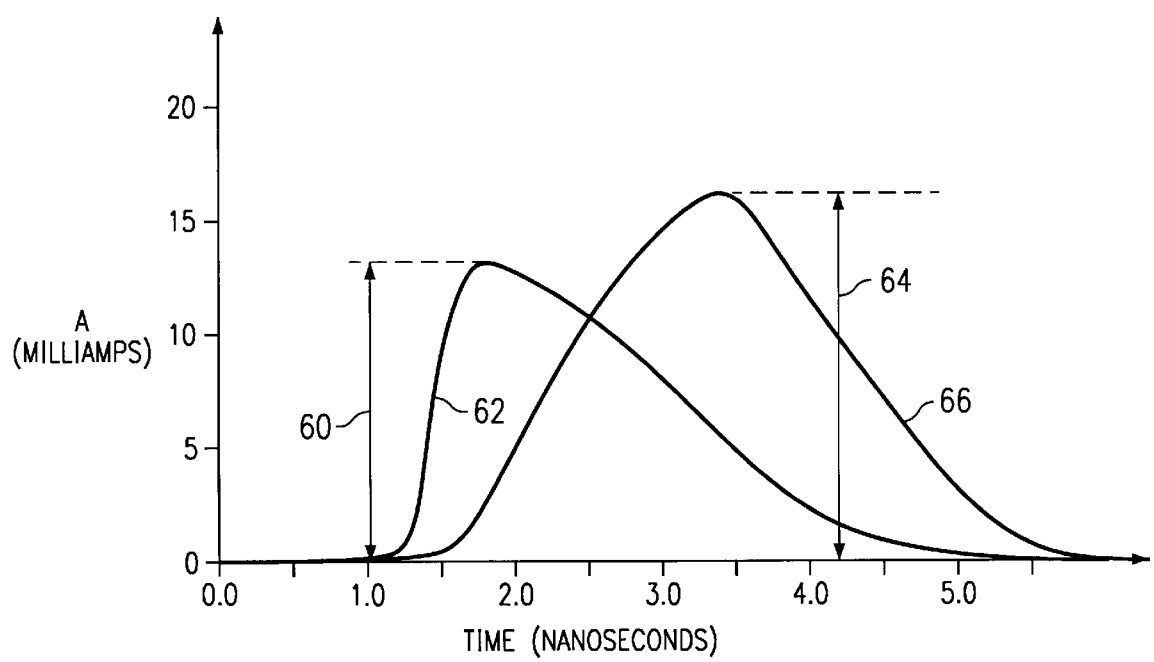
FIG. 13 is graph showing the current vs. time characteristics of the logic circuit of FIG. 9.

Referring to FIGS. 9 and 13, when $V_{DD}$ is 2.5V, (V1 is high), a peak current 60, measured at the SDP signal and represented by a waveform 62, remains low, despite the operation of both the inverter 48a and the NMOS transistor 46a. The peak current (not shown) measured at the SDN signal is also low, despite the operation of both the inverter 48d and the NMOS transistor 44b. In addition, when $V_{DD}$ is 3.3V, (V1 is low), a peak current 64, measured at the SDP signal and represented by a waveform 66, remains low, because the ability of the NMOS transistor 44a to drive current is removed. Likewise, the peak current (not shown) measured at the SDN signal is also low, because the ability of the PMOS transistor 44b to drive current is removed. If $V_{PERI}$, which has a constant voltage level regardless of $V_{DD}$ level variation is used, it si unnecessary to control the PMOS transistor 44b.

Both the first and second implementations of the invention utilize the V1 signal to indicate the power supply operating level, as shown in FIG. 5. The circuits used to generate the V1 signal have been omitted from the prior figures for ease of description. However, many different control circuits can be included to generate the V1 signal, four examples of which are described below with reference to FIGS. 14–18.

Figure 14:
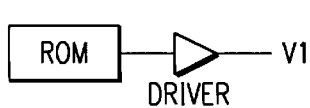
FIG. 14 is a first embodiment of a configurable circuit for generating the V1 voltage signal of FIG. 5.

Referring to FIG. 14, a small, on-chip read only memory (ROM) can be used to produce the V1 signal. For this circuit, the DRAM 20 (FIG. 7) would have another external pad (not shown) that would be used to externally address the ROM. The ROM would be set so that when the bit stored at the address is high, or logic 1, the V1 signal is configured for 3.3V operation; and when the bit stored at the address is low, or logic 0, the V1 signal is configured for 2.5V operation.

Figure 15:
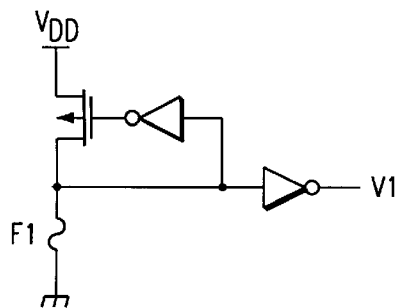
FIG. 15 is a second embodiment of a configurable circuit for generating the V1 voltage signal of FIG. 5.

Referring to FIG. 15, a fused circuit can be used to produce the V1 signal. In this embodiment, a fuse F1 can be blown during the production of the DRAM for chips that will be used only in 3.3V applications, in which case V1 will always be low, and left intact for chips that will be used only in 2.5V applications, in which case V1 will always be high.

Figure 16:
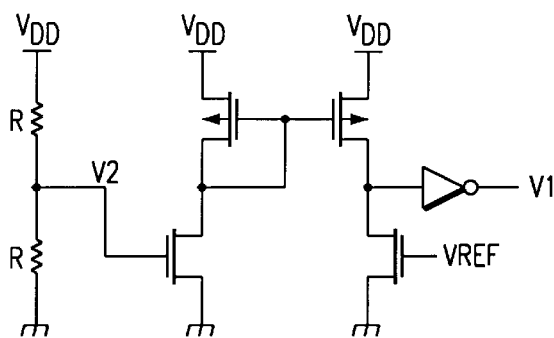
FIG. 16 is a schematic block diagram of a first embodiment of a power supply voltage detection circuit for generating the V1 voltage signal of FIG. 5.

Referring to FIG. 16, a first power supply voltage detection circuit can be implemented to produce the V1 signal. A first reference voltage Vref is designed to always be equal to 1.4V, i.e., the voltage drop across two diodes. A second reference voltage V2 is designed to be equal to half of $V_{DD}$. Therefore, when $V_{DD}$ is less than 2.8V, V2 will be less than 1.4V, thereby driving V1 high. When $V_{DD}$ is greater than 2.8V, V2 will be greater than 1.4V, thereby driving V1 low.

Figure 17:
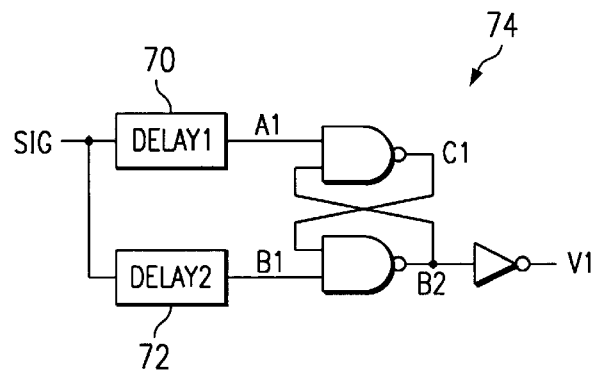
FIG. 17 is a schematic block diagram of a second embodiment of a power supply voltage detection circuit for generating the V1 voltage signal of FIG. 5.
Figure 18:
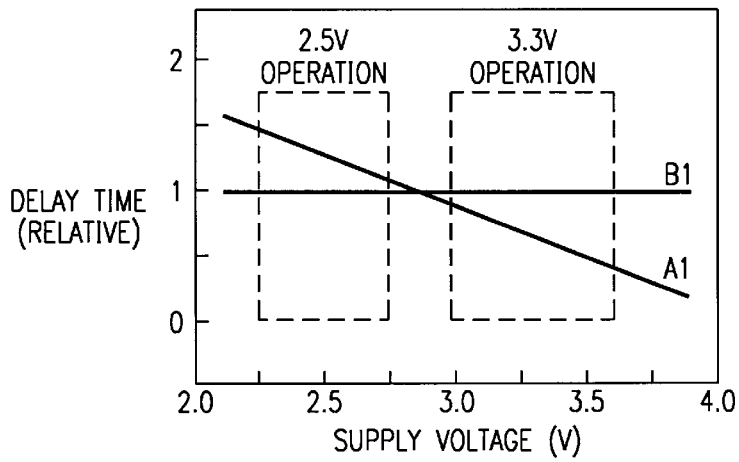
FIG. 18 is a graph showing power supply voltage vs. the delay time of the two delay circuits of FIG. 17.

Referring to FIGS. 17 and 18, a second power supply voltage detection circuit can be implemented to produce the V1 signal. A signal SIG is received by first and second delay circuits 70, 72. The first delay circuit 70, constructed of serially connected inverters (not shown), has an output connected to one input A1 of a flip flop 74. The second delay circuit 72, constructed of an R-C circuit (also not shown), has an output connected to a second input B1 of the flip flop 74. The second delay circuit 72 is designed to provide a constant delay, regardless of the $V_{DD}$ voltage level. In contrast, the first delay circuit 70 is designed such that the delay caused thereby will vary with the $V_{DD}$ voltage level. The first and second delay circuits 70, 72, are designed to provide equal delays when $V_{DD}$ is 2.8V, as shown in FIG. 18.

As a result, when $V_{DD}$ is less than 2.8V, the V1 signal is driven high, and when $V_{DD}$ is greater than 2.8V, the V1 signal is driven low.

Although illustrative embodiments of the present invention have been shown and described, a latitude of modification, change and substitution is intended in the foregoing disclosure, and in certain instances, some features of the invention will be employed without a corresponding use of other features. For example, instead of adjusting to different operating voltages, the control circuits shown in FIGS. 14–18 could be designed to adapt to other conditions that would require the characteristics of the logic circuit to change. Furthermore, additional or alternative buffers, drivers and other circuits may be added without altering the scope of the invention. Accordingly, it is appropriate that the appended claims be construed broadly and in a manner consistent with the scope of the invention.

What is claimed is:

1. A semiconductor memory comprising:

a pair of bit lines;

a plurality of word lines;

a plurality of memory cells each coupled to one of said pair of bit lines and one of said plurality of word lines;

a sense amplifier including a pair of PMOS transistors and a pair of NMOS transistors, wherein each pair of transistors has sources coupled in common, drains coupled to said pair of bit lines, respectively, and gates cross-coupled to said drains, respectively;

a first external pad for receiving one of a first external positive supply voltage and second external positive supply voltage, wherein the voltage value of said first external supply voltage is higher than that of said second external supply voltage;

a second external pad for receiving a ground voltage;

a switch PMOS transistor having a drain coupled to sources of said pair of PMOS transistors and a source coupled to said first external pad;

a first drive transistor having a source-to-drain path provided between a gate of said switch PMOS transistor and said second external pad; and a second drive transistor having a source-to-drain path connected in parallel with said source-to-drain path of said first drive transistor;

wherein one of said first and second drive transistors drives said switch PMOS transistor when said first external supply voltage is supplied to said first external pad; and wherein both of said first and second drive transistors drive said switch PMOS transistor when said second external supply voltage is supplied to said first external pad.

2. A semiconductor memory according to claim 1, further comprising:

a switch NMOS transistor having a drain coupled to said sources of said pair of NMOS transistors and a source coupled to said second external pad;

a third drive transistor having a source-to-drain path provided between a gate of said switch NMOS transistor and said first external pad; and a fourth drive transistor having a source-to-drain path connected to said source-to-drain path of said third drive transistor in parallel;

wherein one of said third and fourth drive transistors drives said switch NMOS transistor when said first external supply voltage is supplied to said first external pad;

wherein both of said third and fourth drive transistors drive said switch NMOS transistor when said second external supply voltage is supplied to said first external pad.

3. A semiconductor memory comprising:

a terminal receiving a power supply voltage;

an internal circuit;

a first MOS transistor having a source-drain path provided between said terminal and said internal circuit;

a second MOS transistor having a source-drain path for supplying a drive signal to a gate of said first MOS transistor;

a third MOS transistor having a source-drain path coupled in parallel with said source-drain path of said second MOS transistor; and a detector outputting a signal indicating whether said power supply voltage corresponds to a first voltage level or a second voltage level being lower than said first voltage level, wherein one of said second and third transistors drives said first MOS transistor when said power supply voltage corresponds to said first voltage level, and wherein both said second and third transistors drive said first MOS transistor when said power supply voltage corresponds to said second voltage level.

4. A semiconductor memory according to claim 3, wherein said internal circuit includes a sense amplifier, and wherein said power supply voltage is supplied to said sense amplifier through said first MOS transistor.

5. A semiconductor memory according to claim 4, wherein said power supply voltage is a positive voltage, and wherein said first MOS transistor is a p-channel type.

6. A semiconductor memory according to claim 5, wherein said second and third MOS transistors are n-channel type and source-drain paths thereof are provided between said gate of first MOS transistor and a ground potential, respectively.

7. A semiconductor memory according to claim 6, wherein said terminal is an external terminal.

8. A semiconductor memory comprising:

a first terminal receiving a first power supply voltage;

a second terminal receiving a second power supply voltage;

an internal circuit;

a first MOS transistor having a source-drain path provided between said first terminal and said internal circuit;

a second MOS transistor having a source-drain path provided between a gate of said first MOS transistor and said second terminal;

a third MOS transistor having a source-rain path coupled in parallel with said source-drain path of said second MOS transistor; and a detector outputting a signal indicating whether said second power supply voltage corresponds to a first voltage level or a second voltage level being lower than said first voltage level, wherein one of said second and third transistors drives said first MOS transistor when said power supply voltage corresponds to said first voltage level, and wherein both said second and third transistors drive said first MOS transistor when said power supply voltage corresponds to said second voltage level.

9. A semiconductor memory according to claim 8, wherein said internal circuit includes a sense amplifier, and wherein said first power supply voltage is supplied to said sense amplifier through said first MOS transistor.

10. A semiconductor memory according to claim 9, wherein said first power supply voltage is a ground voltage, and wherein said first MOS transistor is an n-channel type.

11. A semiconductor memory according to claim 10, wherein said second power supply voltage is a positive voltage, and wherein said second and third MOS transistors are p-channel type.

12. A semiconductor memory according to claim 11, wherein said second terminal is an external terminal.

13. A semiconductor memory comprising:

a terminal receiving a power supply voltage;

an internal circuit;

a first MOS transistor having a source-drain path provided between said terminal and said internal circuit;

a second MOS transistor having a source-drain path for supplying a drive signal to a gate of said first MOS transistor;

a third MOS transistor having a source-drain path coupled in parallel with said source-drain path of said second MOS transistor; and wherein one of second and third transistors drives said first MOS transistor when said power supply voltage corresponds to a first voltage level, and wherein both said second and third transistors drive said first MOS transistor when said power supply voltage corresponds to a second voltage level which is smaller than said first voltage level as the absolute value.

14. A semiconductor memory according to claim 13, wherein said internal circuit includes a sense amplifier, and wherein said power supply voltage is supplied to said sense amplifier through said first MOS transistor.

15. A semiconductor memory comprising:

a first terminal receiving a ground potential;

a second terminal receiving a power supply voltage;

an internal circuit;

a first MOS transistor having a source-drain path provided between said first terminal and said internal circuit;

a second MOS transistor having a source-drain path provided between a gate of said first MOS transistor and said second terminal;

a third MOS transistor having a source-drain path coupled in parallel with said source-drain path of said second MOS transistor; and wherein one of said second and third transistors drives said first MOS transistor when said power supply voltage corresponds to a first voltage level, and wherein both said second and third transistors drive said first MOS transistor when said power supply voltage corresponds to a second voltage level which is smaller than said first voltage level as the absolute value.

16. A semiconductor memory according to claim 15, wherein said internal circuit includes a sense amplifier, and wherein said ground potential is supplied to said sense amplifier through said first MOS transistor.

* * * * *